(12) United States Patent
Wristers et al.

(10) Patent No.: US 6,372,588 B2
(45) Date of Patent: *Apr. 16, 2002

(54) METHOD OF MAKING AN IGFET USING SOLID PHASE DIFFUSION TO DOPE THE GATE, SOURCE AND DRAIN

(75) Inventors: Derick J. Wristers; Robert Dawson; H. Jim Fulford, Jr., all of Austin; Mark I. Gardner, Cedar Creek; Frederick N. Hause, Austin; Mark W. Michael, Cedar Park; Bradley T. Moore, Austin, all of TX (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/837,523

(22) Filed: Apr. 21, 1997

(51) Int. Cl.[7] .............................................. H01L 21/336
(52) U.S. Cl. ....................................... 438/303; 438/564
(58) Field of Search ................................ 438/FOR 320, 438/303, 305, 307, 564, 549, FOR 322, 301

(56) References Cited

U.S. PATENT DOCUMENTS

| 5,457,060 A | 10/1995 | Chang ............................ 437/34 |
| 5,504,031 A | 4/1996 | Hsu et al. ....................... 437/57 |
| 5,710,054 A | 1/1998 | Gardner et al. |
| 5,770,490 A | * 6/1998 | Frenette et al. ............. 438/199 |

* cited by examiner

Primary Examiner—Richard Booth
(74) Attorney, Agent, or Firm—Skjerven Morrill MacPherson, LLP; Stephen A. Terrile

(57) ABSTRACT

A method of making an IGFET using solid phase diffusion is disclosed. The method includes providing a device region in a semiconductor substrate, forming a gate insulator on the device region, forming a gate on the gate insulator, forming an insulating layer over the gate and the device region, forming a heavily doped diffusion source layer over the insulating layer, and driving a dopant from the diffusion source layer through the insulating layer into the gate and the device region by solid phase diffusion, thereby heavily doping the gate and forming a heavily doped source and drain in the device region. Preferably, the gate and diffusion source layer are polysilicon, the gate insulator and insulating layer are silicon dioxide, the dopant is boron or boron species, and the dopant provides essentially all P-type doping for the gate, source and drain, thereby providing shallow channel junctions and reducing or eliminating boron penetration from the gate into the substrate.

28 Claims, 3 Drawing Sheets

METHOD OF MAKING AN IGFET USING SOLID PHASE DIFFUSION TO DOPE THE GATE, SOURCE AND DRAIN

BACKGROUND OF THE INVENTION

1. Field of the Invention

The present invention relates to integrated circuit manufacturing, and more particularly to insulated-gate field-effect transistors with a source and drain formed by solid phase diffusion

2. Description of Related Art

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by a thin insulating layer such as a gate oxide. The operation of the IGFET involves application of an input voltage to the gate, which sets up a transverse electric field in order to modulate the longitudinal conductance of the channel.

In typical IGFET processing, the source and drain are formed by introducing dopants of a second conductivity type (P or N) into the semiconductor substrate of a first conductivity type (N or P) using a patterned gate as a mask. This self-aligning procedure tends to improve packing density and reduce parasitic overlap capacitances between the gate and the source and drain.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, the polysilicon is anisotropically etched to provide a gate which provides a mask during formation of the source and drain by ion implantation, and then the implanted dopant is driven-in and activated using a high-temperature anneal that would otherwise melt the aluminum.

There are several drawbacks to using ion implantation. For instance, a phenomena called "channeling" may occur when the ion beam which implants the dopant is closely aligned with the crystal lattice of the silicon. When channeling occurs, the dopant is initially implanted deep beneath the top surface of the substrate, but then as implantation continues the substrate surface becomes amorphous and less channeling occurs. Unfortunately, the depth of the channeled dopant is difficult to control. Channeling can be avoided by taking the substrate (typically, at an angle of 7°) with respect to the ion beam, but implanting off-axis can cause asymmetric doping of the source and drain. Another drawback of ion implantation is random scattering of the implanted dopant. The random scattering results in a small portion of the implanted regions, measured as the lateral "straggle," being disposed beneath the mask. A further drawback of ion implantation is that the concentration (or doping profile) of the implanted dopant typically forms a gaussian distribution along the vertical axis in which the peak concentration is substantially below the top surface of the substrate, and subsequent high-temperature processing causes the dopant to diffuse further into the substrate.

A strategy for enhancing submicron IGFET performance is to form shallow channel junctions on the order of 100 to 1500 microns deep in order to improve current drive and reduce off-state leakage current. However, even as ion implantation energies are scaled down to the range of 5 to 10 kiloelectron-volts and smaller, it remains difficult or impossible to form well-controlled shallow junctions using conventional semiconductor implantation equipment for the reasons mentioned above.

As an alternative to ion implantation, the introduction of source/drain doping by solid phase diffusion is known in the art. Doped layers such as polysilicon, polycide, silicon dioxide, borosilicate glass (BSG) and phosphosilicate glass (PSG) have been used as a diffusion source for source/drain regions that are self-aligned with the gate. A primary advantage of solid phase diffusion is that the peak dopant concentration in the substrate can occur in close proximity to the top surface of the substrate, thereby providing shallow channel junctions even after bigh-temperature processing.

A problem encountered in P-channel devices with polysilicon gates containing a high concentration of boron is that when a thin gate oxide is used, high temperature steps may cause unwanted boron penetration into the gate oxide, or further, into the underlying channel region. For instance, boron will penetrate thin gate oxides during a 900° C. post-implant anneal in nitrogen. Furthermore, the presence of fluorine in the gate oxide worsens the boron penetration problem. Such fluorine can be introduced into the gate oxide if boron difluoride ($BF_2$) is the implant species. Boron penetration can cause a positive shift in threshold voltage ($V_T$) and increase subthreshold swing ($S_t$). It can also cause other undesirable effects such as increased electron trapping, decreased low-field hole mobility, and decreased drive current due to polysilicon depletion (insufficient polysilicon doping) at the gate oxde interface (which increases the effective thickness of the gate oxide).

Unfortunately, since solid phase diffusion normally requires temperatures of 900° C. or more, the resultant boron penetration may be sufficiently large to substantially degrade device performance.

Accordingly, a need exists for a method of making an IGFET that realizes the advantages of solid phase diffusion while reducing or eliminating boron penetration.

SUMMARY OF THE INVENTION

An object of the invention is to provide a method of making an IGFET using solid phase diffusion to dope the source and drain without diffusing an appreciable amount of any dopant from the gate into the substrate. This is accomplished by providing essentially all doping for the gate, source and drain using a single solid phase diffusion step. In this manner, when solid phase diffusion occurs, the gate is essentially devoid of preexisting dopants that might otherwise diffuse into the substrate.

In accordance with one aspect of the invention, a method of making an IGFET includes providing a device region in a semiconductor substrate, forming a gate insulator on the device region, forming a gate on the gate insulator, forming an insulating layer over the gate and the device region, forming a heavily doped diffusion source layer over the insulating layer, and driving a dopant from the diffusion source layer through the insulating layer into the gate and the device region by solid phase diffusion, thereby heavily doping the gate and forming a heavily doped source and drain in the device region.

Preferably, the gate is polysilicon, the dopant is boron or boron species, the dopant provides essentially all P-type doping for the gate, source and drain, and essentially none of the dopant diffuses from the gate into the substrate. It is also preferred that the diffusion source layer is polysilicon doped in situ to saturation as it is deposited on the insulating layer, the insulating layer and gate insulator are silicon dioxde, and the diffusion source layer is removed after solid phase diffusion occurs.

Advantageously, the invention is well-suited for making P-channel enhancement-mode IGFETs with shallow channel junctions while reducing or eliminating boron penetration from the gate into the substrate.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
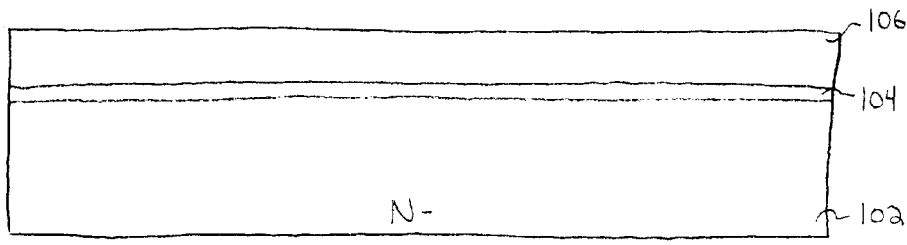
FIGS. 1A–1H show cross-sectional views of successive process steps for forming an IGFET with the gate, source and drain doped by solid phase diffusion in accordance with an embodiment of the invention.

In the drawings, depicted elements are not necessarily drawn to scale and like or similar elements may be designated by the same reference numeral throughout the several views.

In FIG. 1A, a silicon substrate suitable for integrated circuit manufacture is provided. The substrate includes an N-type well (shown) with a planar top surface in a P-type epitaxial surface layer on a P+ base layer (not shown). The N-well has an arsenic background concentration on the order of $1 \times 10^{16}$ atoms/cm$^3$, a <100> orientation and a resistivity of 12 ohm-cm. The N-well can be subjected to a threshold voltage implant and a punch-through implant, as is conventional. For convenience of illustration, a single device region 102 in the N-well is shown, and dielectric isolation (such as LOCOS or shallow trench refill) between adjacent device regions is omitted. A blanket layer of gate oxide 104, composed of silicon dioxide (SiO$_2$), is formed on the top surface of device region 102 using tube growth at a temperature of 700 to 1000° C. in an O$_2$ containing ambient. Gate oxide 104 has a thickness in the range of 30 to 100 angstroms. Thereafter, undoped polysilicon layer 106 is deposited by low pressure chemical vapor deposition (LPCVD) on the top surface of gate oxide 104. Polysilicon layer 106 has a thickness in the range of 1000 to 2000 angstroms.

Figure 1B:
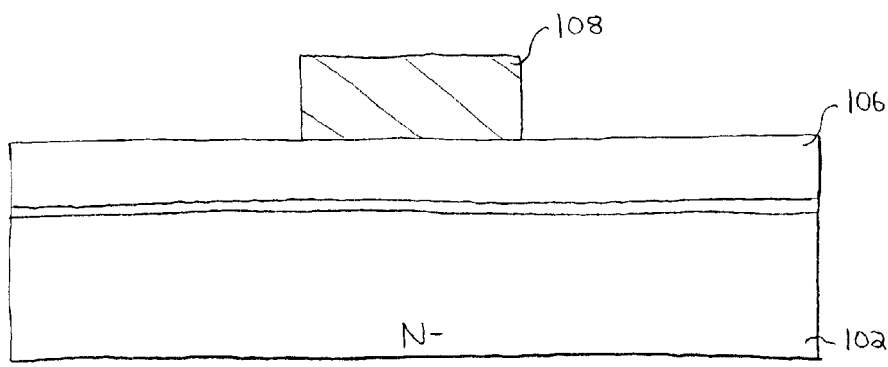

In FIG. 1B, photoresist layer 108 is deposited on polysilicon layer 106. A photolithographic system, such as a step and repeat optical projection system which generates deep ultraviolet fight from a mercury-vapor lamp, uses a reticle to irradiate photoresist layer 108 with an image pattern. Thereafter, the irradiated portions of photoresist layer 108 are removed, and photoresist layer 108 includes openings above selected portions of device region 102.

Figure 1C:
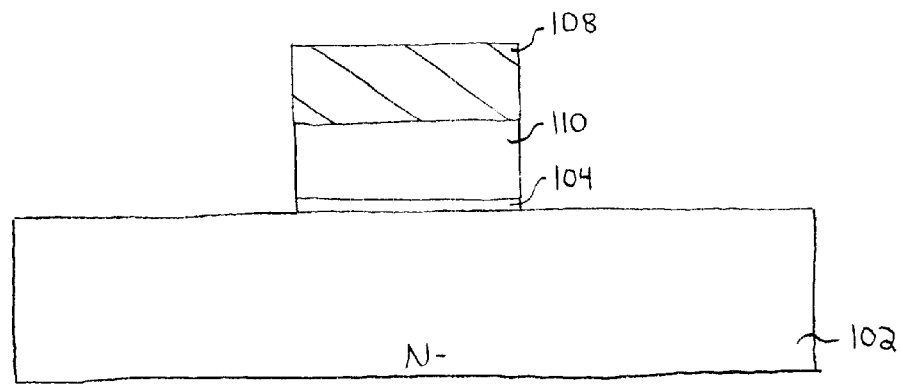

In FIG. 1C, an anisotropic dry etch is applied using photoresist layer 108 as an etch mask. Photoresist layer 108 protects the underlying regions of polysilicon layer 106 and gate oxide 104, and the etch removes the regions of polysilicon layer 106 and gate oxide 104 beneath the openings in photoresist layer 108. Initially, the etch is highly selective of polysilicon with respect to silicon dioxide, so that the etch removes the regions of polysilicon layer 106 beneath the openings in photoresist layer 108, and only a negligible amount of gate oxide 104 is removed. Thereafter, the etch chemistry is changed so that the etch is highly selective of silicon dioxide with respect to silicon, the etch removes the regions of gate oxide 104 beneath the openings in photoresist layer 108, and only a negligible amount of device region 102 is removed. The etch forms polysilicon gate 110 from the unetched portion of polysilicon layer 106, and portions of device region 102 outside polysilicon gate 110 become exposed. Polysilicon gate 110 has opposing vertical sidewalls separated by a length of 3500 angstroms and has a thickness in the range of 1000 to 2000 angstroms.

Figure 1D:
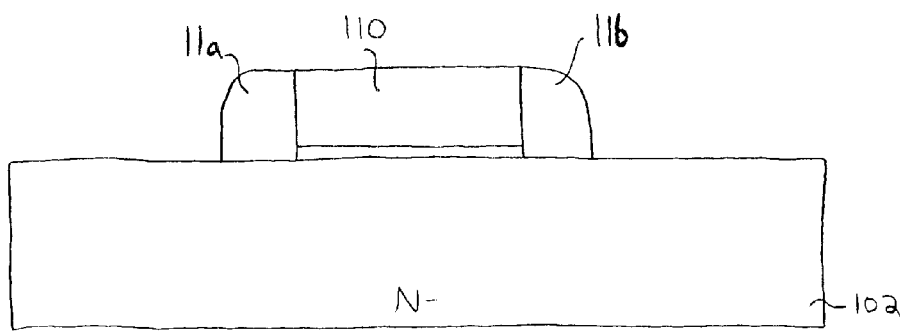

In FIG. 1D, photoresist layer 108 is stripped, and an oxide layer with a thickness in the range of 1000 to 2000 angstroms is confonnauly deposited over the exposed surfaces by plasma enhanced chemical vapor deposition (PECVD) at a temperature in the range of 300 to 450° C. Thereafter, the structure is subjected to an anisotropic reactive ion etch that forms oxide spacers 112 adjacent to the opposing sidewalls of polysilicon gate 110. Oxide spacers 112 each laterally extend about 500 angstroms across device region 102.

Figure 1E:
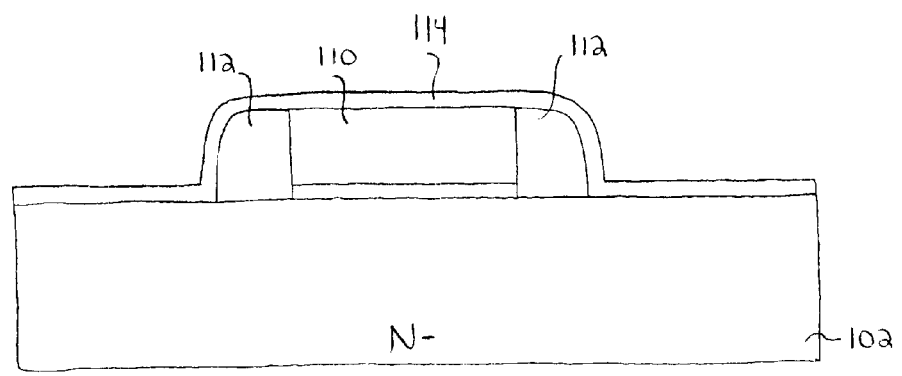

In FIG. 1E, oxide layer 114 with a thickness of 50 angstroms is conformally deposited over the exposed surfaces by PECVD at a temperature in the range of 300 to 450° C. As is seen, oxide layer 114 is deposited on polysilicon gate 110, spacers 112 and the portions of device region 102 outside polysilicon gate 110 and spacers 112.

Figure 1F:
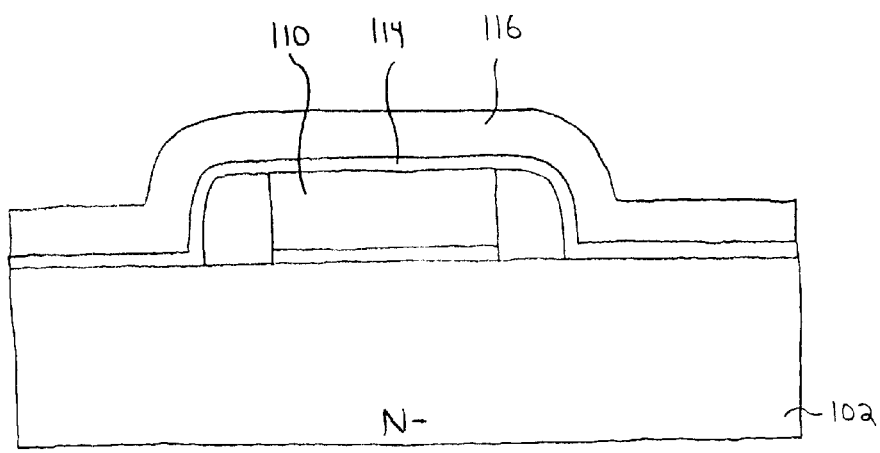

In FIG. 1F, polysilicon layer 116 is blanket deposited by LPCVD on oxide layer 114 and over the entire device region 102, and is doped in situ with boron as deposition occurs. In situ doping involves adding dopant gases such as diborane to the chemical vapor deposition gases, as is well-known in the art. Polysilicon layer 116 is doped to saturation with a boron concentration on the order of $1 \times 10^{21}$ to $1 \times 10^{22}$ atoms/cm$^3$, and has a thickness in the range of 500 to 1000 angstroms.

Of importance, at this point in the process, polysilicon gate 110 and device region 102 are essentially devoid of P-type doping. That is, polysilicon gate 110 continues to be undoped, and device region 102 has been sufficiently counterdoped with arsenic (when the N-well was formed) to annihilate or render ineffective any P-type doping therein.

Figure 1G:
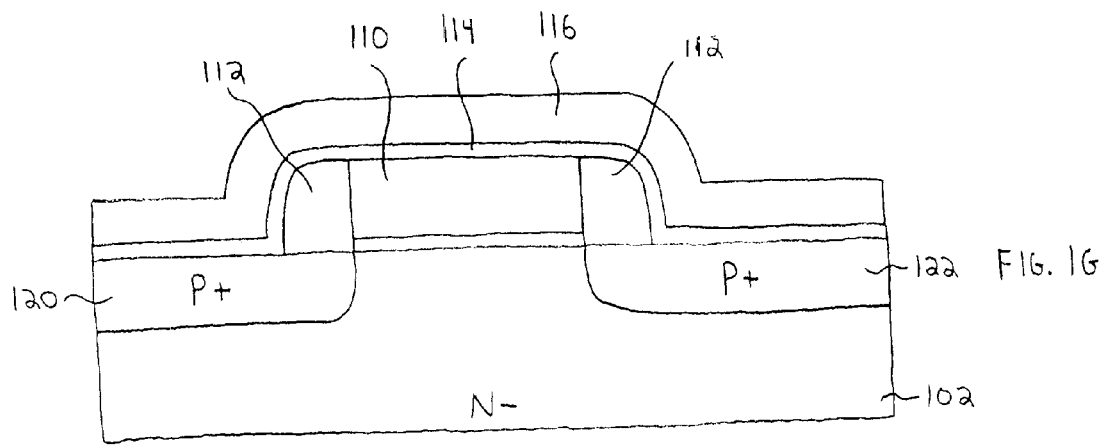

In FIG. 1G, the boron in polysilicon layer 116 is driven into polysilicon gate 110 and device region 102, thereby heavily doping polysilicon gate 110 and forming heavily doped source 120 and drain 122 in device region 102. In particular, a rapid thermal anneal (RTA) on the order of 1000 to 1100° C. is applied for 30 seconds to 3 minutes. As the RTA begins, the boron in polysilicon layer 116 diffuses rapidly into oxide layer 114. As the RTA continues, the boron in oxide layer 114 diffuses into polysilicon gate 110, spacers 112, and device region 102 outside polysilicon gate 110 and spacers 112, and the boron diffused into device region 102 by oxide layer 114 diffuses both vertically and laterally and extends beneath spacers 112. However, essentially none of the boron in polysilicon gate 110 or spacers 112 diffuses into device region 102.

As a result, source 120 and drain 122 are doped P+ with a boron concentration in the range of $1 \times 10^{18}$ to $1 \times 10^{20}$ atoms/cm$^3$, have a depth in the range of 300 to 1000 angstroms, and are activated. In addition, polysilicon gate 110 is now heavily doped with boron and exhibits relatively low resistivity.

Advantageously, the boron that diffuses into polysilicon gate 110 provides heavy doping throughout polysilicon gate 110, so as to avoid polysilicon depletion at the gate oxide interface, while the underlying channel region of device region 102 remains essentially devoid of boron. Furthermore, source 120 and drain 122 have sharp, shallow channel junctions that are substantially aligned with the opposing sidewalls of polysilicon gate 110. Thus, essentially all P-type doping in polysilicon gate 110, source 120 and drain 122 is provided by solid phase diffusion from polysilicon layer 116 without any appreciable boron penetration from polysilicon gate 110 into the channel region of device region 102.

After the RTA is completed, a P-channel enhancement-mode IGFET includes source 120 and drain 122 controlled by polysilicon gate 110.

Figure 1H:
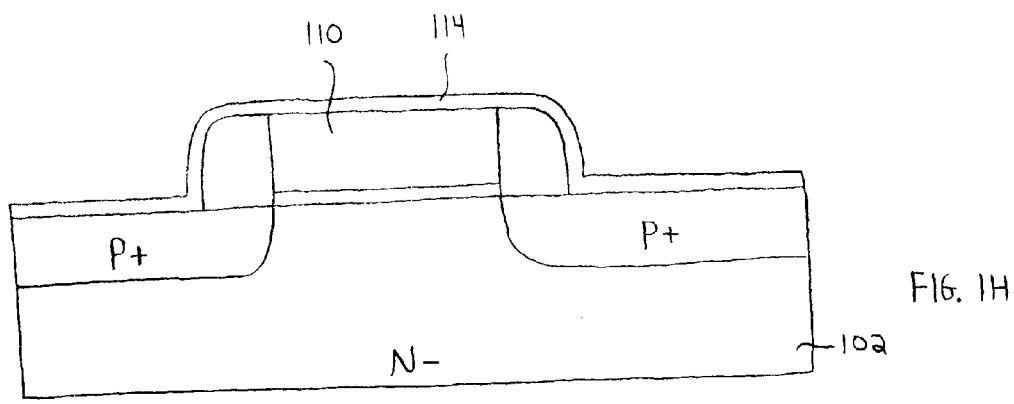

In FIG. 1H, polysilicon layer 116 is removed by applying an isotropic etch that is highly selective of polysilicon with respect to silicon dioxide, so that only a negligible amount of oxide layer 114 is removed and polysilicon gate 110 and device region 102 are essentially unaffected.

Further processing steps in the fabrication of IGFETs typically include forming salicide contacts on the gates, sources and drains, forming a thick oxide layer over the active regions, forming contact windows in the oxide layer to expose the salicide contacts, forming interconnect metallization in the contact windows, and forming a passivation layer over the metallization. In addition, subsequent high-temperature steps can supplement the RTA to provide the desired anneal, activation, and drive-in functions. These further processing steps are conventional. Likewise the principal processing steps disclosed herein may be combined with other steps apparent to those skilled in the art.

At completion of the process, it is preferred that the lateral locations of the channel junctions be precisely controlled. However, to the extent that these locations are not (or can not be) precisely controlled, it is far preferable to have a slight overlap between the junctions and the bottom surface of the gate as opposed to a lateral displacement or gap. While a slight overlap will lead to capacitive effects (known as "Miller capacitance") that tend to reduce switching speeds, a lateral displacement or gap may prevent the formation of a conductive channel between the source and drain during device operation. The overlap is a function of numerous factors, including the dopant concentration in the source and drain, the diffusion temperatures, and the spacer dimensions.

The present invention includes numerous variations to the embodiment described above. For instance, oxide layer 114 can be thermally grown, and polysilicon layer 116 can be deposited undoped and then subsequently doped beyond saturation by ion implantation. Gate oxide 104 outside polysilicon gate 110 need not necessarily be removed. The spacers are optional. Alternatively, oxide spacers 112 can be omitted and silicon nitride ($Si_3N_4$) spacers can be formed on oxide layer 114 before depositing polysilicon layer 116. The gate can be various conductors, the gate insulator and insulating layer can be various dielectrics, and the diffusion source layer can be various materials. Suitable N-type dopants include arsenic and phosphorus; suitable P-type dopants include boron $B_{10}$, boron $B_{11}$, and $BF_x$ species such as $BF_2$.

The invention is particularly well-suited for fabricating N-channel MOSFETs, P-channel MOSFETs, and other types of IGFETs, particularly for high-performance microprocessors where high circuit density is essential. Although only a single IGFET has been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of making an IGFET, comprising the steps of:
    providing a device region of a first conductivity type in a semiconductor substrate;
    forming a gate insulator on the device region;
    forming a gate on the gate insulator;
    forming an insulating layer over the gate and the device region;
    forming a heavily doped diffusion source layer over the insulating layer; and
    diffusing a dopant of a second conductivity type from the diffusion source layer through the insulating layer into the device region and throughout the gate, without driving essentially any of the dopant through the gate into the device region, thereby heavily doping the gate and forming a heavily doped source and drain in the device region so that the diffusion provides essentially all the dopant of the second conductivity type, and substantially no dopant of the first conductivity type, in the gate, source and drain.

2. The method of claim 1, wherein the source and drain consist of heavily doped regions.

3. The method of claim 1, including removing the diffusion source layer after driving the dopant.

4. The method of claim 1, wherein forming the diffusion source layer includes depositing the diffusion source layer and doping the diffusion source layer with the dopant in situ.

5. The method of claim 1, wherein the source and drain include channel junctions with a depth in the range of 300 to 1000 angstroms.

6. The method of claim 1, wherein the diffusion source layer and the gate are polysilicon, and the gate insulator and the insulating layer are silicon dioxide.

7. The method of claim 1, wherein the dopant is selected from the group consisting of boron and boron species.

8. The method of claim 1, including using the IGFET in an integrated circuit chip.

9. The method of claim 1, including using the IGFET in an electronic system including a microprocessor, a memory and a system bus.

10. A method of making an IGFET, comprising the steps of:
    providing a device region of a first conductivity type in a semiconductor substrate;
    forming a gate insulator on the device region;
    forming an undoped polysilicon gate on the gate insulator;
    forming an insulating layer over the gate and the device region;
    forming a polysilicon diffusion source layer over the insulating layer, wherein the diffusion source layer is heavily doped with a dopant of a second conductivity type;

applying a thermal cycle to drive the dopant from the diffusion source layer through the insulating layer into the device region and throughout the gate by solid phase diffusion without driving essentially any of the dopant through the gate into the device region, thereby heavily doping the gate the second conductivity type and forming a heavily doped source and drain of the second conductivity type in the device region so that the solid phase diffusion provides essentially all the dopant of the second conductivity type, and substantially no dopant of the first conductivity type, in the gate, source and drain; and removing the diffusion source layer.

11. The method of claim 10, wherein the source and drain consist of heavily doped regions of the second conductivity type.

12. The method of claim 10, wherein forming the diffusion source layer includes depositing the diffusion source layer and doping the diffusion source layer with the dopant in situ.

13. The method of claim 10, wherein the forming the diffusion source includes depositing the diffusion source layer and then implanting the dopant into the diffusion source layer.

14. The method of claim 10, including forming the insulating layer on a top surface and opposing sidewalls of the gate.

15. The method of claim 14, including forming the diffusion source layer only on the insulating layer.

16. The method of claim 10, including forming spacers adjacent to opposing sidewalls of the gate, and forming the insulating layer over the spacers.

17. The method of claim 16, including forming the diffusion source layer only on the insulating layer.

18. The method of claim 10, including forming spacers on the insulating layer and in close proximity to opposing sidewalls of the gate.

19. The method of claim 18 including forming the diffusion source layer only on the insulating layer and the spacers.

20. The method of claim 10, including depositing the insulating layer by chemical vapor deposition and then depositing the diffusion source layer by chemical vapor deposition.

21. The method of claim 10, wherein the source and drain are entirely within the device region and do not extend above a top surface of the substrate beneath the gate insulator.

22. The method of claim 10, wherein the source and drain include channel junctions that are substantially aligned with opposing sidewalls of the gate.

23. The method of claim 10, wherein the source and drain include channel junctions with a depth in the range of 300 to 1000 angstroms.

24. The method of claim 10, including removing the diffusion source layer without removing the insulating layer.

25. The method of claim 10, wherein the thermal cycle is a rapid thermal anneal.

26. The method of claim 10, wherein the gate insulator and insulating layer are silicon dioxide.

27. The method of claim 10, wherein the dopant is selected from the group consisting of boron and boron species.

28. A method of making a P-channel enhancement-mode IGFET with essentially all P-type doping in a gate, source and drain provided simultaneously by solid phase diffusion, the method comprising the following steps in the sequence set forth:

providing an N-type device region in a semiconductor substrate;

forming a gate oxide on the device region;

forming a polysilicon gate on the gate oxide and over the device region;

forming oxide spacers adjacent to opposing sidewalls of the gate;

forming an oxide layer over the gate, the spacers and the device region;

forming a polysilicon diffusion source layer on the oxide layer, wherein the diffusion source layer is heavily doped with a dopant selected from the group consisting of boron and boron species, and the gate and device region are essentially devoid of P-type doping;

applying a rapid thermal anneal to drive the dopant from the diffusion source layer through the oxide layer into the device region and throughout the gate without driving essentially any of the dopant through the gate into the device region, thereby heavily doping the gate P-type, forming a heavily doped P-type source and drain entirely within the device region, and providing essentially all P-type doping for the gate, source and drain; and removing the diffusion source layer.

* * * * *